United States Patent [19]

Jason

[11] Patent Number: 5,225,687
[45] Date of Patent: Jul. 6, 1993

[54] OUTPUT CIRCUIT WITH OPTICALLY COUPLED CONTROL SIGNALS

[76] Inventor: Barry L. Jason, 325 Warbler Dr., Bedford, Tex. 76021

[21] Appl. No.: 826,054

[22] Filed: Jan. 27, 1992

[51] Int. Cl.⁵ .............................................. G02B 27/00
[52] U.S. Cl. ...................................... 250/551; 307/311
[58] Field of Search ............... 250/551, 214 R, 214 A, 250/214 C, 214 SW; 307/311

[56] References Cited

U.S. PATENT DOCUMENTS

| | | | |
|---|---|---|---|
| 4,390,790 | 6/1983 | Rodriguez | 250/551 |
| 4,647,794 | 3/1987 | Guajardo | 250/551 |
| 4,739,174 | 4/1988 | Nagano | 250/551 |
| 4,777,387 | 10/1988 | Collins | 250/551 |
| 4,873,448 | 10/1989 | Shirai | 250/551 |
| 4,912,335 | 3/1990 | Ehalt et al. | 250/551 |
| 5,006,737 | 4/1991 | Fay | 307/311 |

Primary Examiner—David C. Nelms
Assistant Examiner—Michael Messinger

[57] ABSTRACT

An output circuit is disclosed in which the signals to instruct the output devices to conduct or to non-conduct are coupled to the devices through optical signals. The effects of undesired parasitic signals which distort the desired signal are compensated for by capacitors in the circuit. The speed of operation for the circuit is substantially higher than can be achieved using phototransistor detection methods.

18 Claims, 2 Drawing Sheets

OUTPUT CIRCUIT WITH OPTICALLY COUPLED CONTROL SIGNALS

BACKGROUND OF THE INVENTION

1. Field of the Invention

This invention relates to supplying control signals to the output devices in a totem-pole or bridge connection where a common reference cannot be maintained between the control signal source and the input terminals of the output devices.

2. Description of the Related Art

Totem-pole connections of power transistors have been used in output driver circuits of supply power to a load device. Each totem-pole circuit is formed by a series connection of a pair of power devices. A bridge circuit can be formed by the combination of a pair of totem-pole drivers so that the load device can float between the outputs of the two totem-pole circuits and not require a direct connection to one of the supply terminals.

A common problem with using totem-pole or bridge circuits of this type is that it is difficult to provide control signals to the power devices due to the lack of a single common reference connection to each of the power devices in the circuit. Several solutions to this problem are presented in the literature, the most common of which is to use a transformer to couple the appropriate signals to the input terminals of the power devices. Of course, the desireable characteristic of the transformer is its ability to couple signals between its input terminals and its output terminals without having a wired connection between the input terminals and the output terminals. The coupling takes place because of the magnetic fields shared between the input and output connections.

The use of transformers to couple the signals to the input terminals of the power devices does have some disadvantages. If the signal being coupled to the output devices contains significant low frequency energy, the transformers are larger and heavy, and are generally of the iron-core variety. Further, transformers cannot couple dc signals, and the leakage inductance of the transformer can cause problems, such as overshoot in the output signal.

Another method to provide control signals to the output devices of totem-pole or bridge circuits is to optically couple the signal from a light emitting diode (LED) to a photodetecting transistor at the input terminals of the output devices. The LED-phototransistor method of coupling the signal also has problems as it is presently shown in the literature. First, the LED-phototransistor coupler is slow, and limits the maximum possible switching speed of the output circuit. This can be a significant restriction for the use of this method in Pulse Width Modulation output circuits. Another limitation of the LED-phototransistor coupler is the sensitivity of the base terminal of the phototransistor. The base terminal of the phototransistor has a high current gain (the beta, or hfe of the transistor), and as a result, signals which get parasitically coupled to this node (such as the inherent parasitic capacitances) can get amplified significantly. This amplified signal due to the parasitic coupling is undesired, and causes distortion in the output signal.

A more complete discussion of methods to couple signals to output devices appears in the Motorola Data Book *Power MOSFET Transistor Data*, Chapter 2-6, "Gate Drive Requirements," Q2/89, DL135, REV 3, to which the reader is referred for background and a more detailed analysis.

SUMMARY OF THE INVENTION

It is, accordingly, an object of this invention to provide an output circuit where high speed signals can be coupled to the output devices through optical signals.

It is a further object of this invention to provide an output circuit with optically coupled control signals, for which undesirable, parasitically induced signals are substantially compensated.

In accordance with the present invention, therefore, an output circuit is disclosed which is composed of a pair of output devices for the totem-pole configuration, and four devices for the bridge configuration, an LED to generate the optical signal for each output device, a detecting diode for responding to each of the optical signals, a means to convert the small signals at the output of the detecting diodes into signals of sufficient voltage and current capability to drive the input terminals of the output devices, and capacitors to compensate for parasitically induced signals.

BRIEF DESCRIPTION OF THE DRAWINGS

The present invention will be better understood when read in light of the accompanying drawings in which.

DESCRIPTION OF THE PREFERRED EMBODIMENT

Figure 1:
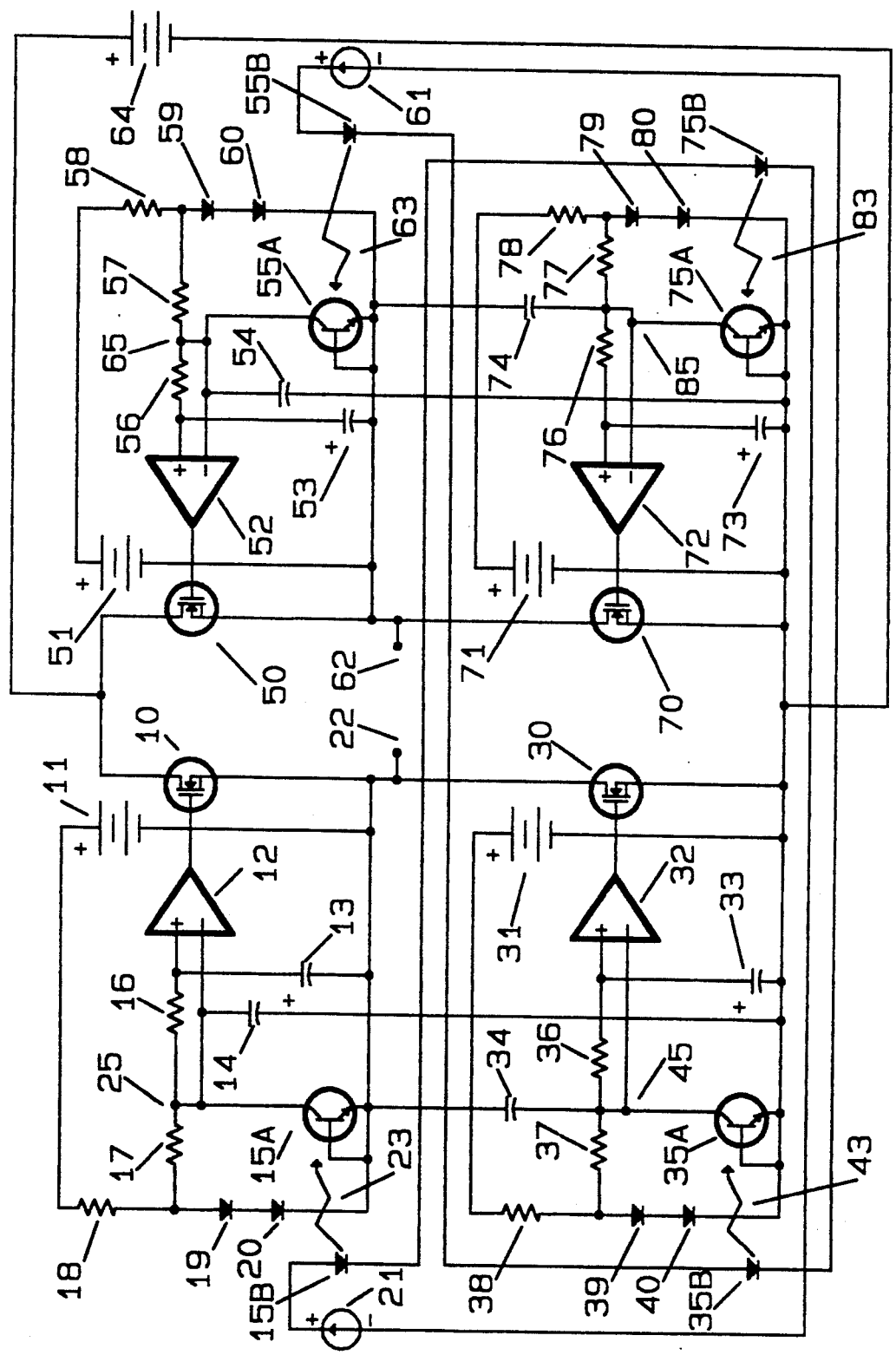
FIG. 1 is a circuit schematic of a bridge output circuit using the method of optically coupling the signals to the output devices, and compensating for parasitically induced signals, according to the present invention.

Referring to FIG. 1, the output circuit shown here is a bridge type where the output devices for this implementation are N-channel MOSFETs. The output load network for this type of circuit would be connected between output terminals 22 and 62. The output devices 10 and 70, or 30 and 50, are switched on in pairs so that either polarity of voltage can be supplied to the load device connected between 22 and 62. The source of power that is switched to the load by the output devices is supplied by the power source 64.

The signal sources which provide the control signals to instruct which pair of devices to turn on are indicated by current sources 21 and 61. In most applications of bridge circuits, only a single pair of output devices are turned on at a given instant of time. Thus, the signal sources 21 and 61 are generally 180 degrees out of phase. Signal source 21 supplies current to the Light Emitting Diode (15B) of opto-coupler 15, and because of the series connection of 15B and 75B, also to the LED (75B) of opto-coupler 75. Thus a source of current from 21 simultaneously creates an optical signal in opto-couplers 15 and 75.

The output of opto-coupler 15 is from the collector-base diode of the transistor 15A. By connecting the base of 15 to the emitter, the emitter-base junction is zero biased, preventing the transistor from detecting the optical signal. This results in a much faster response to the optical signal, at the expense of a reduced output signal from the opto-coupler.

Voltage source 11, resistor 18, and diodes 19 and 20 provide a fixed bias potential for one terminal of resistor 17. The output current signal of opto-coupler 15 produces a voltage signal across the load resistor 17. This voltage signal is passed through a low pass filter consisting of the combination of resistor 16, and capacitor 13, and then used to bias the + input terminal of comparator 12. Thus the dc voltage applied to the +input terminal is the average value of the signal voltage appearing across resistor 17.

When signal source 21 supplies a current to LED 15B, an optical signal is produced which is detected by 15A. The current generated by 15A produces a voltage across R17 which causes a reduction in voltage on the --input of the comparator. The comparator responds to the conditions where the−terminal is lower in voltage than the+terminal, and causes its output voltage to go to the high voltage state. This high voltage is directly connected to the gate-to-source terminals of MOSFET 10, which causes it to enter the conducting state. A similar set of conditions occur in the driver circuitry to MOSFET 70, causing it to simultaneously also enter the conducting state.

As mentioned previously, sources 21 and 61 are 180 degrees out of phase, and thus at the point that current from source 21 is just beginning to be applied to 15B and 75B, source 61 is returning to a state where zero current is supplied to 55B and 35B. The set of conditions in the driver circuits to MOSFETs 30 and 50 are complementary to those described in the drivers for 10 and 70. At the point when MOSFETs 10 and 70 are transitioning into the conducting state, MOSFETs 30 and 50 are transitioning into the non-conducting state.

Nodes 25, 45, 65, and 85 are relatively high impedance nodes, and are sensitive to voltages which may be parasitically induced in them. These nodes can have voltages induced in them which distort the desired signals. For example, if node 22 is connected to some ground (reference) potential, and parasitic capacitances exist between this reference potential and node 85, at the point when MOSFETs 10 and 70 begin to conduct, and MOSFETs 30 and 50 begin to non-conduct, the parasitic capacitances from the reference potential to node 85 will induce a voltage in node 85 that is opposite to the voltage which opto-coupler 75 is causing to appear at that node. Under these conditions device 70 can be caused to momentarily return to the non-conducting state when it is desired for it to be conducting. Under the complementary set of control signals from 21 and 61, device 70 can be caused to momentarily return to the conducting state when it is desired for it to be non-conducting. This last condition can be destructive due to the fact that both devices 50 and 70 can be momentarily conducting at the same instant, with no element to limit the current being supplied by source 64 through the devices 50 and 70. Some of the undesirable parasitic capacitances can be reduced by proper layout and shielding, however, a certain portion of these are inherent in the package designs of the component parts of the circuit.

To counteract the problems introduced by small parasitic capacitances to nodes 25, 45, 65, and 85, small compensating capacitors 14, 34, 54, and 74 are introduced into the circuit which have the effect of reinforcing the proper voltages on these nodes. For example, when MOSFET 10 begins to conduct, and MOSFET 30 becomes non-conducting, the location of capacitor 14 between node 25 and the−terminal of 64 is such that the increase in voltage across 14 introduces a voltage in node 25 that reinforces the voltage that opto-coupler 15 is producing on node 25. The locations and connections for capacitors 34, 54, and 74 are also chosen such that they reinforce the appropriate voltages on nodes 45, 65, and 85.

The values of the capacitors 14, 34, 54, and 74 are not critical because it is not necessary to precisely cancel the effect of parasitic capacitances on nodes 25, 45, 65, and 85, but they need to be merely large enough to cause a reinforcing voltage to appear on these nodes, rather than a reversing effect. Because the parasitic capacitances are generally very small, capacitors 14, 34, 54, and 74 can be formed by small, appropriately placed platings on the circuit's printed wiring board.

Figure 2:
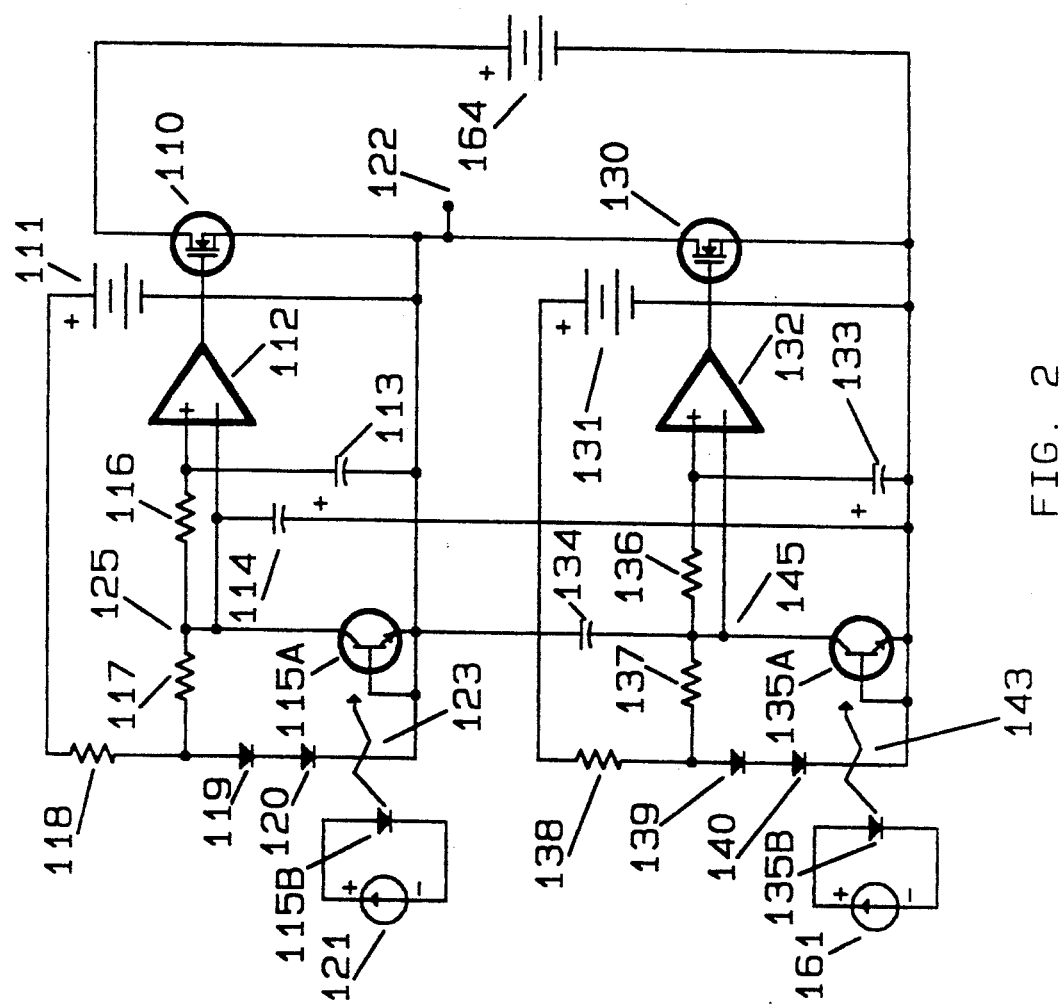
FIG. 2 is a circuit schematic of a totem-pole output circuit using the method of optically coupling the signals to the output devices, and compensating for parasitically induced signals, according to the present invention.

Referring to FIG. 2, the output circuit shown here is a totem-pole type circuit similar to the previously described bridge type of circuit, but with half the number of output devices and driver circuits. The output load network for this type of circuit would be connected between output terminal 122 and either the drain terminal of MOSFET 110 or the source terminal of MOSFET 130. The source of power that is switched to the load is supplied by the power source 164.

The signal sources which provide the control signals to instruct which pair of devices to turn on are indicated by current sources 121 and 161. In most applications of totem-pole circuits, only a single output device is turned on at a given instant of time. Thus, the signal sources 121 and 161 are generally 180 degrees out of phase. Signal source 121 supplies current to the Light Emitting Diode (115B) of opto-coupler 115.

The output of opto-coupler 115 is from the collector-base diode of the transistor 115A. Voltage source 111, resistor 118, and diodes 119 and 120 provide a fixed bias potential for one terminal of resistor 117. The output current signal of opto-coupler 115 produces a voltage signal across the load resistor 117. This voltage signal is passed through a low pass filter consisting of the combination of resistor 116, and capacitor 113, and then used to bias the+input terminal of comparator 112. Thus the dc voltage applied to the+input terminal is the average value of the signal voltage appearing across resistor 117.

When signal source 121 supplies a current to LED 115B, an optical signal is produced which is detected by 115A. The current generated by 115A produces a voltage across R117 which causes a reduction in voltage on the−input of the comparator. The comparator responds to the conditions where the−terminal is lower in voltage than the+terminal, and causes its output voltage to go to the high voltage state. This high voltage is directly connected to the gate-to-source terminals of MOSFET 110, which cause it to enter the conducting state.

As mentioned previously, sources 121 and 161 are 180 degrees out of phase, and thus at the point that current from source 121 is just beginning to be applied to 115B, source 161 is returning to a state where zero current is supplied to 135B. The set of conditions in the driver circuits to MOSFET 130 is complementary to those described in the drivers for 110. At the point when MOSFET 110 is transitioning into the conducting state, MOSFETs 130 is transitioning into the non-conducting state.

Nodes 125, and 145 are relatively high impedance nodes, and are sensitive to voltages which may be parasitically induced in them. These nodes can have voltages induced in them by small parasitic capacitances which distort the desired signals.

To counteract the problems introduced by small parasitic capacitances to nodes 125, and 145 small compensating capacitors 114, and 134 are introduced into the circuit which have the effect of reinforcing the proper voltages on these nodes.

The values of the capacitors 114, and 134 are not critical because it is not necessary to precisely cancel the effect of parasitic capacitances on nodes 125, and 145 but they need to be merely large enough to cause a reinforcing voltage to appear on these nodes, rather than a reversing effect. Because the parasitic capacitances are generally very small, capacitors 114, and 134 can be formed by small, appropriately placed platings on the circuit's printed wiring board.

While the present invention has been described in connection with the preferred embodiments of the various figures, it is to be understood that similar embodiments may be used and modifications and additions may be made to the described embodiments for performing the same functions of the present invention without deviating therefrom. Therefore, the scope of the invention is to be determined by reference to the claims which follows.

What is claimed is:

1. An output circuit having an output terminal comprising a power source for the output circuit having a first and a second terminal, a first and a second signal source each having a first and a second terminal, a first and a second means for generating optical signals each having a first and a second terminal, a first and a second means for detecting the optical signals each having a first and a second terminal, a first and a second bias circuit means, a first and a second output device means each having a first, second and third terminal, a first and a second converter means each having a first and a second input terminal and an output terminal, and a first and a second compensating circuit means each having a first and a second terminal, in which:

the first terminal of the first signal source is connected to the first terminal of the first means for generating optical signals;

the second terminal of the first signal source is connected to the second terminal of the first means for generating optical signals;

the first terminal of the second signal source is connected to the first terminal of the second means for generating optical signals;

the second terminal of the second signal source is connected to the second terminal of the second means for generating optical signals;

the first terminal of the first output device means is connected to the first terminal of the power source for the output circuit;

the second terminal of the first output device means is connected to the output terminal of the first converter means;

the third terminal of the first output device means is connected to the first terminal of the second output device means, to the first terminal of the first optical detecting means, to the first bias circuit means, to the first terminal of first compensating circuit means, and to the output terminal of the output circuit;

the second terminal of the first optical detecting means is connected to the first input terminal of the first converter means, to the first terminal of the second compensating circuit means, and to the first bias circuit means;

the second input terminal of the first converter means is connected to the first bias circuit means;

the second terminal of the second output device means is connected to the output terminal of the second converter means;

the third terminal of the second output device means is connected to the second terminal of the power source for the output circuit, to the first terminal of the second optical detecting means, to the second bias circuit means, and to the second terminal of the second compensating circuit means;

the second terminal of the second optical detecting means is connected to the first input terminal of the second converter means, to the second terminal of the first compensating circuit means, and to the second bias circuit means;

the second input terminal of the second converter means is connected to the second bias circuit means.

2. The output circuit of claim 1 in which the first and second means for generating optical signals are Light Emitting Diodes.

3. The output circuit of claim 1 in which the first and second means for detecting optical signals are photodetecting diodes.

4. The output circuit of claim 1 in which the first and second means for detecting optical signals are the collector-base junctions of photodetecting transistors.

5. The output circuit of claim 1 in which the first and the second converter means are differential comparators, in which:

the first input terminal is the inverting input terminal of the comparator, and the second input terminal is the non-inverting input terminal of the comparator.

6. The output circuit of claim 1 in which the first and second bias circuits are comprised of a power source for the bias circuit having a first and a second terminal, a first, second, and third resistors each having a first and a second terminal, a first and a second diode each having a first and a second terminal, and a capacitor having a first and a second terminal, in which:

the first terminal of the power source for the bias circuit is connected to the first terminal of the first resistor;

the second terminal of the first resistor is connected to the first terminal of the first diode, and to the first terminal of the second resistor;

the second terminal of the first diode is connected to the first terminal of the second diode;

the second terminal of the second resistor is connected to the first terminal of the third resistor, to the second terminal of the optical detecting means, to the first terminal of the converter means, and to one terminal of the compensating circuit means;

the second terminal of the third resistor is connected to the first terminal of the capacitor, and to the second input terminal of the converter means;

the second terminal of the power source for the bias circuit is connected to the second terminal for the capacitor, and to the second terminal of the second diode.

7. The output circuit of claim 1 in which the first and the second output device means are MOS Field Effect Transistors.

8. The output circuit of claim 1 i which the first and the second compensating circuit means are capacitors.

9. The output circuit of claim 1 in which the first and the second compensating circuit means are metal platings on a printed wiring board.

10. An output circuit having a first and a second output terminal comprising a power source for the output circuit having a first and a second terminal, a first and a second signal source each having a first and a second terminal, a first, second, third, and fourth means for generating optical signals each having a first and a second terminal, a first, second, third, and fourth means for detecting the optical signals each having a first and a second terminal, a first, second, third, and fourth bias circuit means, a first, second, third, and fourth output device means each having a first, second and third terminal, a first, second, third, and fourth converter means each having a first and a second input terminal and an output terminal, and a first, second, third, and fourth compensating circuit means each having a first and a second terminal, in which:

the first terminal of the first signal source is connected to the first terminal of the first means for generating optical signals;

the second terminal of the first means for generating optical signals is connected to the first terminal of the second means for generating optical signals;

the second terminal of the first signal source is connected to the second terminal of the second means for generating optical signals;

the first terminal of the second signal source is connected to the first terminal of the third means for generating optical signals;

the second terminal of the third means for generating optical signals is connected to the first terminal of the fourth means for generating optical signals;

the second terminal of the second signal source is connected to the second terminal of the fourth means for generating optical signals;

the first terminal of the first output device means is connected to the first terminal of the power source for the output circuit;

the second terminal of the first output device means is connected to the output terminal of the first converter means;

the third terminal of the first output device means is connected to the first terminal of the second output device means, to the first terminal of the first optical detecting means, to the first bias circuit means, to the first terminal of first compensating circuit means, and to the first output terminal of the output circuit;

the second terminal of the first optical detecting means is connected to the first input terminal of the first converter means, to the first terminal of the second compensating circuit means, and to the first bias circuit means;

the second input terminal of the first converter means is connected to the first bias circuit means;

the second terminal of the second output device means is connected to the output terminal of the second converter means;

the third terminal of the second output device means is connected to the second terminal of the power source for the output circuit, to the first terminal of the second optical detecting means, to the second bias circuit means, and to the second terminal of the second compensating circuit means;

the second terminal of the second optical detecting means is connected to the first input terminal of the second converter means, to the second terminal of the first compensating circuit means, and to the second bias circuit means;

the second input terminal of the second converter means is connected to the second bias circuit means;

the first terminal of the third output device means is connected to the first terminal of the power source for the output circuit;

the second terminal of the third output device means is connected to the output terminal of the third converter means;

the third terminal of the third output device means is connected to the first terminal of the fourth output device means, to the first terminal of the third optical detecting means, to the third bias circuit means, to the first terminal of third compensating circuit means, and to the second output terminal of the output circuit;

the second terminal of the third optical detecting means is connected to the first input terminal of the third converter means, to the first terminal of the fourth compensating circuit means, and to the third bias circuit means;

the second input terminal of the third converter means is connected to the third bias circuit means;

the second terminal of the fourth output device means is connected to the output terminal of the fourth converter means;

the third terminal of the fourth output device means is connected to the second terminal of the power source for the output circuit, to the first terminal of the fourth optical detecting means, to the fourth bias circuit means, and to the second terminal of the fourth compensating circuit means;

the second terminal of the fourth optical detecting means is connected to the first input terminal of the fourth converter means, to the second terminal of the third compensating circuit means, and to the fourth bias circuit means;

the second input terminal of the fourth converter means is connected to the fourth bias circuit means.

11. The output circuit of claim 10 in which the first, second, third, and fourth means for generating optical signals are Light Emitting Diodes.

12. The output circuit of claim 10 in which the first, second, third, and fourth means for detecting optical signals are photodetecting diodes.

13. The output circuit of claim 10 in which the first, second, third, and fourth means for detecting optical signals are the collector-base junctions of photodetecting transistors.

14. The output circuit of claim 10 in which the first, second, third, and fourth converter means are differential comparators, in which:

the first input terminal is the inverting input terminal of the comparator and the second input terminal is the non-inverting input terminal of the comparator.

15. The output circuit of claim 10 in which the first, second, third, and fourth bias circuits are comprised of a power source for the bias circuit having a first and a second terminal, a first, second, and third resistors each having a first and a second terminal, a first and a second diode each having a first and a second terminal, and a capacitor having a first and a second terminal, in which:

the first terminal of the power source for the bias circuit is connected to the first terminal of the first resistor;

the second terminal of the first resistor is connected to the first terminal of the first diode, and to the first terminal of the second resistor;

the second terminal of the first diode is connected to the first terminal of the second diode;

the second terminal of the second resistor is connected to the first terminal of the third resistor, to the second terminal of the optical detecting means, to the first terminal of the converter means, and to one terminal of the compensating circuit means;

the second terminal of the third resistor is connected to the first terminal of the capacitor, and to the second input terminal of the converter means;

the second terminal of the power source for the bias circuit is connected to the second terminal for the capacitor, and to the second terminal of the second diode.

16. The output circuit of claim 10 in which the first, second, third, and fourth output device means are MOS Field Effect Transistors.

17. The output circuit of claim 10 in which the first, second, third, and fourth compensating circuit means are capacitors.

18. The output circuit of claim 10 in which the first, second, third, and fourth compensating circuit means are metal platings on a printed wiring board.

* * * * *